United States Patent [19]

Privett, III et al.

[11] Patent Number: 5,292,596

[45] Date of Patent: Mar. 8, 1994

[54] FORCE-TRANSMITTING SURFACES OF TITANIUM PROTECTED FROM FRETTING FATIGUE BY A COATING OF CO-NI-FE

[75] Inventors: Hugh M. Privett, III, Palm Beach Gardens, Fla.; Shiro Fujishiro, Tokyo, Japan

[73] Assignees: United Technologies Corporation, Hartford, Conn.; The United States of America as represented by the Secretary of the Air Force, Washington, D.C.

[21] Appl. No.: 932,148

[22] Filed: Aug. 19, 1992

Related U.S. Application Data

[63] Continuation-in-part of Ser. No. 699,283, May 13, 1991, abandoned.

[51] Int. Cl.⁵ .............................................. B32B 15/00
[52] U.S. Cl. .................................. 428/660; 428/678; 428/680; 420/581
[58] Field of Search .................. 423/660, 678, 680; 420/580, 581, 459, 435

[56] References Cited

U.S. PATENT DOCUMENTS

| | | | |
|---|---|---|---|
| 2,787,503 | 4/1957 | Palsulich et al. | 384/280 |
| 2,941,882 | 6/1960 | Franklin et al. | 420/581 |
| 3,083,448 | 4/1963 | Moore et al. | 428/660 |
| 3,143,383 | 8/1964 | Bamberger et al. | 428/678 |
| 3,297,552 | 1/1967 | Gisser et al. | 428/660 |
| 3,647,424 | 3/1972 | Majesko | 420/84 |
| 4,024,303 | 9/1975 | Hahn | 427/295 |
| 4,137,370 | 1/1979 | Fujishiro et al. | 428/660 |
| 4,181,590 | 1/1980 | Fujishiro et al. | 427/528 |
| 4,215,181 | 7/1980 | Betts | 428/591 |
| 4,293,171 | 10/1979 | Kakumoto et al. | 384/492 |
| 4,305,998 | 12/1981 | Manty et al. | 428/660 |
| 4,364,969 | 12/1982 | Dearnaley et al. | 427/531 |
| 4,761,346 | 5/1986 | Naik | 428/627 |
| 4,848,934 | 1/1985 | Blakely et al. | 384/206 |
| 4,921,405 | 11/1988 | Wilson | 416/241 |
| 4,946,749 | 8/1990 | Restall et al. | 428/661 |
| 4,956,858 | 2/1989 | Upadhya | 378/133 |
| 5,006,419 | 4/1991 | Grunke et al. | 428/660 |
| 5,116,690 | 5/1992 | Brindley et al. | 428/614 |
| 5,126,213 | 6/1992 | Restall | 428/660 |

OTHER PUBLICATIONS

"Ion-Plated Coating On Titanium Alloy", Technical Report AFML-TR-79-4109, Aug. 1979, T. A. Eckler.
"Investigation of the Formation of Cobalt-Nickel-Iron Ternary Alloy", Technological Institute of Water Purification and Corrosion Protection, Sofia, Bulgaria. Translated from Elektrokhimiya, vol. 26, No. 3, Mar. 1990. 1990 Plenum Publishing Corp.

*Primary Examiner*—Michael Lewis
*Assistant Examiner*—N. M. Nguyen
*Attorney, Agent, or Firm*—Herbert W. Mylius

[57] ABSTRACT

A method is disclosed for protecting a force-transmitting or force-receiving surface of titanium from fretting fatigue. The method constitutes coating the surface with a coating of an alloy of nickel, cobalt, and iron.

5 Claims, 1 Drawing Sheet

FORCE-TRANSMITTING SURFACES OF TITANIUM PROTECTED FROM FRETTING FATIGUE BY A COATING OF CO-NI-FE

The invention was made under a U.S. Government contract and the Government has rights herein.

BACKGROUND OF THE INVENTION

1. Cross Reference to Related Application

This is a continuation-in-part of patent application Ser. No. 07/699,283, filed May 13, 1991, in the names of Privett et al, now abandoned.

2. Field of the Invention

The invention relates to a method for protecting a force-transmitting surface of titanium from fretting, and to a method for reducing fretting fatigue resulting from high velocity contact of mating surfaces.

3. Description of the Prior Art

Fretting wear occurs on force-transmitting surfaces of parts which contact each other with a high frequency, low amplitude motion. Specifically, this phenomenon occurs in assemblies wherein a force-transmitting surface is in rotating, sliding or oscillating contact with a second surface. Since each surface contains many microscopic asperities in contact, the fretting motion tends to cause local adhesion at these contact points, which may fracture, producing material transfer, wear debris, or both. If the materials in contact are similar, or their constituent elements have high mutual solubilities, the majority of the fretting wear will be adhesive in nature. Elevated temperatures will greatly accelerate the process, as may large loads and high frequencies. If the mating surfaces become extremely abraded and roughened, stress concentrations will result in wear scarring, and a reduction in fatigue strength (known specifically as fretting fatigue) will result, causing failure of the part or parts. Thus, fretting fatigue stress comprises a surface pressure or compression and an alternating shear stress or strain between force-transmitting and force-receiving surfaces. Specific examples of materials subject to fretting fatigue include compressor blade roots of jet aircraft engines, friction dampers, bearings on shafts with loose fits, and drive-coupling components. In these applications, fretting fatigue failures may occur at loads far under the fatigue strength limit of the alloy. It is also to be noted that fretting fatigue is aggravated by conditions of high temperature, and by higher loadings, or pressure, at the interface of the contacting surfaces.

Prior art efforts to overcome the onset of fretting have involved providing anti-fretting coatings on the surfaces in contact, which coatings constitute soft metallic films, keeping the substrate surfaces from coming in direct contact, and dissipating vibrational energy by intracoating shear mechanisms. Such prior art anti-fretting coatings have generally constituted copper based alloys, such as Cu-Ni or Cu-Ni-In, such as set forth by Bamberger et al, U.S. Pat. No. 3,143,383. Such coatings have, in general, been limited to use where temperatures did not exceed approximately 750° F.

OBJECTS OF THE INVENTION

It is an object of the present invention to minimize fretting fatigue of at least one of a pair of contacting titanium or titanium alloy surfaces by providing an anti-fretting coating on one or both surfaces.

SUMMARY OF THE INVENTION

In accordance with the method of the invention, force-transmitting and receiving surfaces of titanium may be protected from fretting fatigue by coating either one or both of the surfaces with a coating of an alloy of cobalt, nickel, and iron. The thickness of the coating may be within the range of 1 to 1000 microns, preferably 10 to 20 microns. Such a coating may be applied by any technique which provides uniform coatings of such thicknesses, exemplary of which are physical vapor deposition techniques, such as cathodic arc deposition; chemical vapor deposition; sputtering; thermal spray techniques, such as plasma spray; and electrodeposition techniques, such as electroplating.

The term "titanium" as used herein and in the claims includes both commercially pure titanium and titanium-base alloys, such as those suitable for aerospace application, and titanium intermetallics. Exemplary titanium alloys include Ti-5Al-2.5Sn, Ti-3Al-2.5V, Ti-6Al-4V, Ti-6Al-2Sn-4Zr-2Mo, Ti-8Al-1V-1Mo, and Ti-6Al-2Sn-4Zr-6Mo.

BRIEF DESCRIPTION OF THE DRAWING

The Figure is a graph showing the results of fretting fatigue testing of specimens produced in accordance with the method of the invention.

DESCRIPTION OF THE PREFERRED EMBODIMENT

Figure 1:
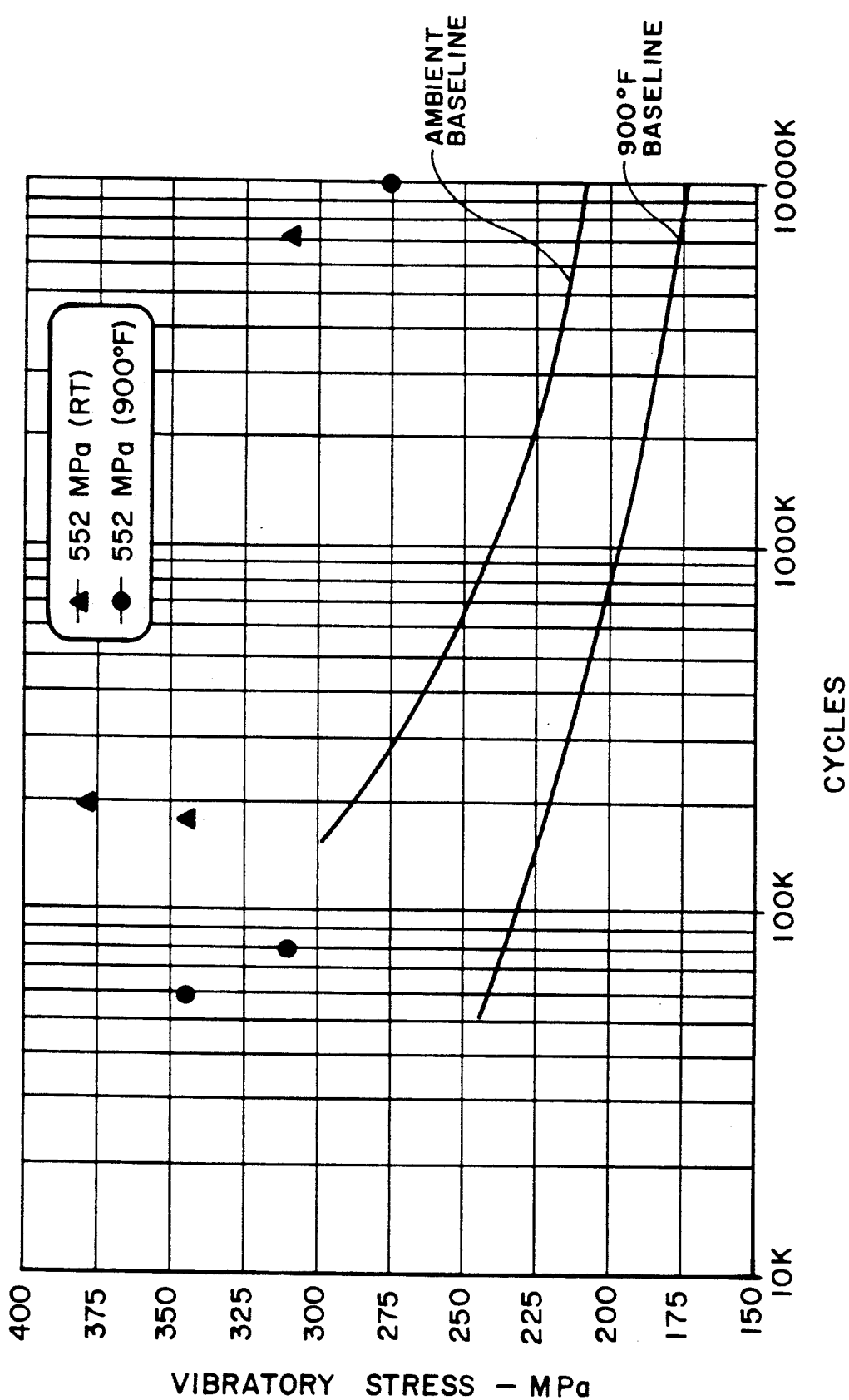

It has been determined that providing a surface coating in accordance with the method of the invention yields a significant improvement in fretting fatigue life of titanium-base alloys as compared to uncoated surfaces at temperatures up to at least 900° F. The invention is also effective for use with commercially pure titanium, as well as titanium-base alloys. The benefit is greater, however, with titanium-base alloys, which are used in higher temperature applications than commercially pure titanium. The coating of the invention finds particular utility with titanium-base alloy surfaces of compressor blade roots, but can be applied with beneficial results to any titanium-base alloy surface configuration where fretting fatigue is a problem.

Since the coating of the invention has been found to be beneficial at temperatures of from 900° F. to 1200° F., it has been found to provide notable advantages over conventional methods of minimizing fretting fatigue, which include the use of dry film lubricants and coatings of alloys, such as aluminum-bronze, copper-nickel, and copper-nickel-indium. These conventional coatings are deficient in being effective only at temperatures up to about 750° F. This maximum useful temperature is below the temperatures encountered in many applications where fretting fatigue is a problem, including compressor blade roots.

With the coating of the present invention, it has been determined that the presence of a solid solution of cobalt and nickel minimizes oxidation of the contact surfaces in the high-temperature environments encountered during use of the coated titanium-base alloy surfaces. This results in retention of the lubricating properties of the coating at temperatures exceeding 750° F., at which temperatures conventional coatings are rendered ineffective. The iron content of the present coating serves to further improve the lubricant properties thereof at elevated temperature by oxidizing to form hematite ($Fe_2O_3$). By retaining lubricating properties at these elevated temperatures, resistance against fretting fatigue is maintained in applications of titanium-base alloys for which conventional coating materials are not effective.

In addition, it has been found that titanium surfaces coated with the anti-fretting coating of the present invention are capable of withstanding higher loadings than surfaces coated with conventional anti-fretting coatings of the prior art. That is, less fretting is observed for high loadings applied to the coatings of the present invention than for the same loadings upon a surface having a Cu-Ni anti-fretting coating.

As previously indicated, surfaces of titanium may be protected from fretting fatigue by coating either one or both of the surfaces with a coating of an alloy of cobalt, nickel, and iron. The alloy composition may be within the range of 30 to 70% cobalt, 25 to 55% nickel, and 5 to 25% iron, by weight. Preferably, the coating comprises from 40 to 60% cobalt, 30 to 50% nickel, and 5 to 15% iron. Most preferably, the coating is of an alloy of about 45 to 55% cobalt, about 35 to 45% nickel, and about 10% iron.

Preferably, the coating is deposited to a thickness of from 10 to 20 microns, with a surface finish not exceeding 16 microinches A.A., or $R_a$, roughness average. Roughness average is the arithmetic average (A.A.) of the absolute values of the measured profile height deviation taken within the sampling length and measured from the graphical centerline, as defined by the American National Standards Institute, ANSI/ASME B46.1-1985, which is incorporated herein by reference.

EXAMPLE 1

In accordance with the present invention, test specimens of a titanium-base alloy of the composition Ti-6Al-2Sn-4Zr-2Mo were coated by ion vapor deposition coating. Coating was performed in a conventional low pressure inert gas ion vapor deposition chamber to deposit a 10 micron coating of the alloy composition, in weight percent, 45 cobalt, 45 nickel, and 10 iron.

Evaluation of the coating for fretting fatigue resistance was accomplished by fully reversed bending (R = −1) high cycle fretting fatigue testing. All specimens were vibrated to failure or 10 million cycles, which was considered the endurance limit. Each specimen was individually loaded and calibrated to determine test deflection limits. The test involved varying the bending load at approximately 100 Hz and determining cycles to failure (or endurance limit). An electromagnet provided a vibrational stimulation to the specimen. A magnetic pickup was attached to the titanium specimens. During the specimen vibration the fretting bars, loaded normal to the specimen surface, produced a small oscillatory displacement at the specimen surface such that fretting wear and fatigue cycling of the specimen occurred simultaneously. Testing was performed at ambient temperature and 900° F. A complete uncoated baseline at both temperatures was generated and the results of the test with coated specimens was plotted against the baseline regression curve.

The Figure shows the results of the evaluation. A substantial increase in fretting fatigue life was realized at all vibratory stress levels with the application of the nickel-cobalt-iron coating in accordance with the invention at both ambient temperature and at 900° F. The bearing stress was 552 MPa. Surprisingly, it was also found that when the bearing load was increased from 172 to 552 MPa, the number of cycles withstood by the sample prior to failure increased, rather than decreased, at 900° F. Although copper-nickel coatings demonstrate some slight degree of improvement under higher loadings at elevated temperature, the coating of the present invention provided a substantially increased degree of improvement under higher loadings at 900° F.

EXAMPLE 2

A sample of gamma titanium aluminide was coated to a nominal thickness of 10 microns with an alloy of 45% cobalt, 45% nickel, and 10% iron, as above. Upon testing at both ambient temperature and at 1200° F., it was found that the effect of the coating was to reduce fretting and subsequent fretting fatigue of the intermetallic, in that the coating permitted dramatically increased loading on the part, or alternatively, permitted a substantial increase in the number of cycles to which the part could be subjected, prior to failure.

It is to be understood that the above description of the invention is subject to considerable modification, change, and adaptation by those skilled in the art, and that such modifications, changes, and adaptations are intended to be considered within the scope of the present invention, which is set forth by the claims which follow.

What is claimed is:

1. A metallic structure subject to fretting, said structure comprising a substrate selected from titanium, titanium alloys, and titanium intermetallics, said substrate having an anti-fretting coating on the surface thereof, wherein the improvement comprises said coating being consisting essentially of, by weight, from about 30 to about 70% cobalt, from about 25 to about 55% nickel, and from about 5 to about 25% iron, said iron being oxidizable to hematite at elevated temperature said coating having a thickness of from 1 to about 1000 microns.

2. The structure of claim 1, wherein said coating comprises from about 40 to about 60% cobalt, from about 30 to about 50% nickel, and from about 5 to about 15% iron.

3. The structure of claim 2, wherein said coating comprises from about 45 to about 55% cobalt, from about 30 to about 50% nickel, and about 10 weight percent iron.

4. The structure of claim 3, wherein said coating is from about 10 to about 20 microns thick, and has a surface finish not exceeding 16 microinches roughness average.

5. The structure of claim 4, wherein said coating is applied by ion vapor deposition.

* * * * *

UNITED STATES PATENT AND TRADEMARK OFFICE
CERTIFICATE OF CORRECTION

PATENT NO. : 5,292,596
DATED : March 8, 1994
INVENTOR(S) : Hugh M. Privett III et al It is certified that error appears in the above-identified patent and that said Letters Patent is hereby corrected as shown below:

On title page, item [54] and col. 1, lines 1-3, change the title from "FORCE-TRANSMITTING SURFACES OF TITANIUM PROTECTED FROM PRETTING FATIGUE BY A COATING OF CO-NI-FE" to
--FORCE-TRANSMITTING SURFACES OF TITANIUM PROTECTED FROM FRETTING FATIGUE BY A COATING OF CO-NI-FE--.

Signed and Sealed this

Sixteenth Day of August, 1994

Attest:

BRUCE LEHMAN

Attesting Officer     Commissioner of Patents and Trademarks